United States Patent
Hsiao et al.

(10) Patent No.: US 6,284,677 B1
(45) Date of Patent: Sep. 4, 2001

(54) METHOD OF FORMING FLUOROSILICATE GLASS (FSG) LAYERS WITH MOISTURE-RESISTANT CAPABILITY

(75) Inventors: Chih-Hsiang Hsiao, Taichung; Chih-Ching Hsu, Hsinchu, both of (TW)

(73) Assignee: United Semiconductor Corp., Hsinchu (TW)

(*) Notice: Subject to any disclaimer, the term of this patent is extended or adjusted under 35 U.S.C. 154(b) by 0 days.

(21) Appl. No.: 08/868,752

(22) Filed: Jun. 5, 1997

(30) Foreign Application Priority Data

Apr. 18, 1997 (TW) .................................. 86105073

(51) Int. Cl.$^7$ .................................................. H01L 21/31
(52) U.S. Cl. .................................. 438/783; 427/579
(58) Field of Search .......................... 438/784, 788, 438/776, 777, 792, 624, 763, 783; 427/579, 535; 148/DIG. 118, DIG. 114, DIG. 902

(56) References Cited

U.S. PATENT DOCUMENTS

| | | | |
|---|---|---|---|
| 4,732,761 | * 3/1988 | Machida | 437/228 |
| 5,458,687 | * 10/1995 | Shichida | 118/724 |
| 5,629,246 | * 5/1997 | Iyer | 438/763 |
| 5,661,334 | * 8/1997 | Akram | 257/632 |
| 5,700,736 | * 12/1997 | Muroyama | 438/622 |
| 5,869,149 | * 2/1999 | Denison | 427/579 |

FOREIGN PATENT DOCUMENTS

405090249 * 4/1993 (JP) .
408148562 * 6/1996 (JP) .

OTHER PUBLICATIONS

Wolf, Stanely, Silicon Processing for the VLSI Era, vol.2 p346–47, 1990.*
Laxman, Ravi, "Low epsilon dielectrics: CVD fluorinated Silicon Dioxides" Semiconductor International, p71–74, May 1995.*
Wolf, Stanley, et al., Silicon Processing for the VLSI Era, vol. 1, pp. 191–194, 1986.*
Takeishi, S., et al., "Stabilizing Dielectric Constatns of Fluorine–Doped SiO2 Films by N2O Plasma Annealing" DUMIC Conference, pp 257–259, Feb. 1995.*

* cited by examiner

*Primary Examiner*—Charles Bowers
*Assistant Examiner*—Craig Thompson
(74) *Attorney, Agent, or Firm*—Finnegan, Henderson, Farabow, Garrett & Dunner, L.L.P.

(57) ABSTRACT

A method is provided for forming fluorosilicate glass (FSG) layers that serve as inter-metal dielectric (IMD) layers in a semiconductor wafer with a high moisture-resistant capability. In particular, the method can nonetheless allow the resultant semiconductor circuit to have a low RC delay. The method includes the step of subjecting the FSG layer to a plasma treatment so as to form a moisture-resistant layer over the FSG layer. In the plasma treatment, the ionized gas of ammonia is used as the plasma. As a result of this plasma treatment, a layer of nitrogen-containing compound having a high moisture-resistant property is formed over the FSG layer, which serves as a moisture-resistant layer that can protect the FSG layer from absorbing moistures.

5 Claims, 1 Drawing Sheet

METHOD OF FORMING FLUOROSILICATE GLASS (FSG) LAYERS WITH MOISTURE-RESISTANT CAPABILITY

BACKGROUND OF THE INVENTION

1. Field of the Invention

This invention relates to semiconductor fabrication processes, and more particularly, to a method of forming fluorosilicate glass (FSG) layers that serve as inter-metal dielectric (IMD) layers in a semiconductor wafer with a high moisture-resistant capability.

2. Description of Related Art

With semiconductor fabrication technologies advance to the submicron level of integration, the transistor elements in a semiconductor chip, such as MOS (metal-oxide semiconductor) transistors, are formed with even smaller line widths. The inter-metal dielectrics (IMD) that are used to isolate conductive layers in the chip should therefore have relatively high dielectric constant so as to provide reliable isolation. It is a well known principle in electronics that the operating speed of a circuit is inversely proportional to the RC (resistance-capacitance) delay in that circuit. In a semiconductor chip, the IMD layers have a capacitance C that would cause an RC delay to the signals processed by the chip. This capacitance is proportional to the dielectric constant K of the IMD layers.

Conventionally, undoped-silicate glass (USG) is used to form IMD layers in a semiconductor chip. However, one drawback to the use of USG is that it has a high dielectric constant K that will result in a high capacitance for the chip. A new dielectric, the fluorosilicate glass (FSG), is now widely used instead of USG to form the IMD layers. The dielectric constant K of FSG is dependent on the concentration of fluor (F) therein—the higher the flour concentration, the lower is the dielectric constant K of the FSG. However, a high flourine concentration will also cause the FSG to have high moisture absorbing property, which can cause the fluorine atoms in the FSC to react with the hydrogen atoms in the absorbed moisture, thus forming hydrofluoric acid (HF) that can easily cause erosion to the semiconductor components in the chip.

FIG. 1 is a schematic sectional diagram used to depict a conventional method for forming a layer of fluorosilicate glass (FSG) 10 over a semiconductor substrate that will be moisture-resistant. This method includes the step of forming a layer of undoped-silicate glass (USG), such as a silicon oxide ($SiO_2$), over the FSG layer 10. The USG layer 12 has a high moisture-resistant property so that it can protect the underlying FSG layer 10 from absorbing moistures.

One drawback to the foregoing method, however, is that the USG layer 12 has a high dielectric constant K that causes the resultant IMD layer, which is here a combination of the FSG layer 10 and the USG layer 12, to have a high capacitance C, and thus a high RC delay for the semiconductor circuit on the chip. This will, as mentioned earlier, result in a degradation to the performance of the semiconductor circuit.

SUMMARY OF THE INVENTION

It is therefore a primary objective of the present invention to provide a method for forming fluorosilicate glass (FSG) layers with a high moisture-resistant capability while nonetheless allowing the resultant semiconductor circuit to have a low RC delay.

In accordance with the foregoing and other objectives of the present invention, a new method for forming fluorosilicate glass (FSG) layers in a semiconductor wafer is provided.

The method of the invention including the step of subjecting the FSG layer to a plasma treatment so as to form a moisture-resistant layer over the FSG layer. In the plasma treatment, the ionized gas of ammonia is used as the plasma. As a result of this plasma treatment, a layer of nitrogen-containing compound having a high moisture-resistant property is formed over the FSG layer, which serves as a moisture-resistant layer that can protect the FSG layer from absorbing moistures.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1:
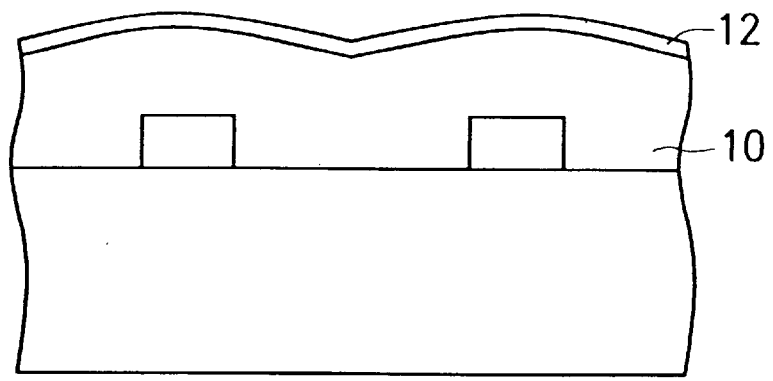
FIG. 1 is a schematic sectional diagram used to depict a conventional method for forming fluorosilicate glass (FSG) with moisture-resistant capability.
Figure 2A:
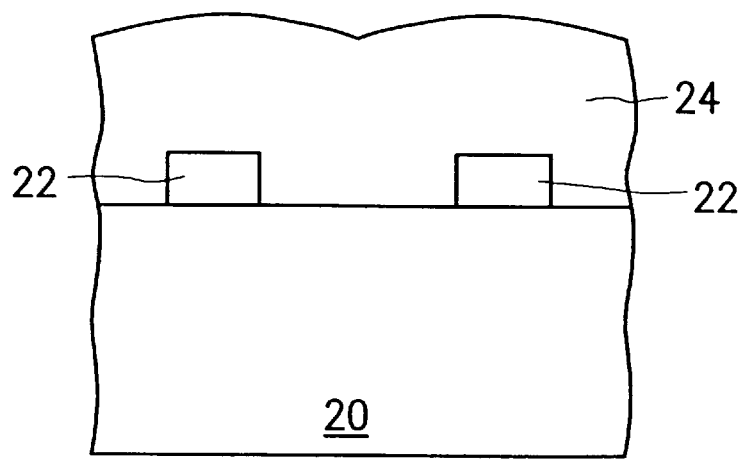
FIGS. 2A and 2B are schematic sectional diagrams used to depict the steps involved in the method of the invention for forming an FSG layer with moisture-resistant capability.
Figure 2B:
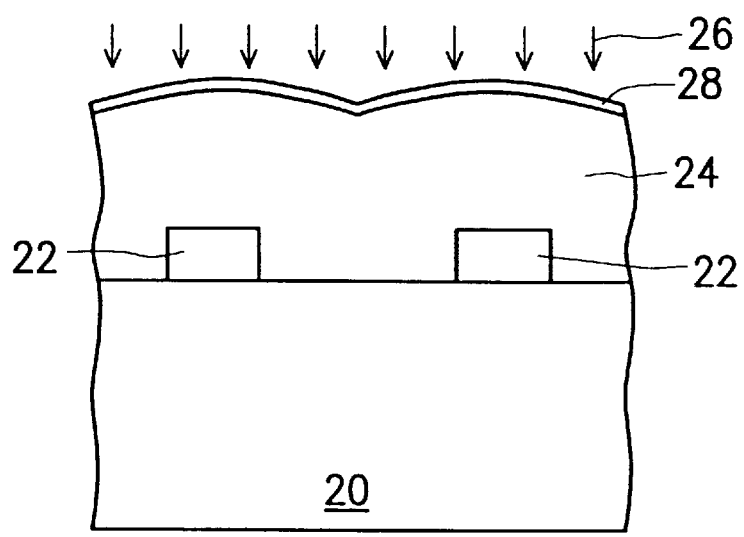

FIGS. 2A and 2B are schematic sectional diagrams used to depict the steps involved in the method of the invention for forming a layer of fluorosilicate glass (FSG) in a semiconductor wafer with moisture-resistant capability.

Referring first to FIG. 2A, in the first step, a semiconductor substrate 20, such as a silicon substrate, is prepared. Over the substrate 20, a plurality of semiconductor components 22, such as a plurality of MOS transistors each having a gate region and a pair of source/drain regions, are formed. Subsequently, a layer of fluorosilicate glass (FSG) 24 is formed over the entire top surface of the substrate 20, which serves as an inner dielectric layer, such as a preliminary metal dielectric (PMD) layer or an inter-metal dielectric (IMD) layer.

Referring next to FIG. 2B, in the subsequent step, the FSG layer 24 is subject to a plasma treatment, in which the FSG layer 24 is exposed to an atmosphere of an ionized gas (plasma), such as the ionized gas of ammonia. As a result of this treatment, a layer of nitrogen-containing compound 28, which has a high moisture-resistant property, is formed over the FSG layer 24 (this layer is hereinafter referred to as a moisture-resistant layer). This moisture-resistant layer 28 can protect the underlying FSG layer 24 from absorbing moistures, and moreover, it has a low dielectric constant that will not increase the overall dielectric constant of the resultant IMD layer The RC delay of the semiconductor components in the chip is therefore low.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming an FSG layer on a semiconductor substrate with a moisture-resistant capability, comprising the step of:

subjecting the FSG layer to a treatment with a plasma consisting essentially of an ionized gas of ammonia to form a moisture-resistant layer over the FSG layer, the moisture-resistant layer having a low dielectric constant such that the moisture-resistant layer does not increase a dielectric constant of a resultant layer of the FSG layer and the moisture-resistant layer.

2. The method of claim 1, wherein the moisture-resistant layer is a layer of nitrogen-containing compound.

3. A semiconductor fabrication process, comprising the step of:

preparing a semiconductor substrate;

forming a plurality of semiconductor components on the substrate;

forming a layer of fluorosilicate glass serving as an inter-metal dielectric layer over the semiconductor components on the substrate; and subjecting the fluorosilicate glass layer to a treatment with a plasma consisting essentially of an ionized gas of ammonia to form a moisture-resistant layer over the fluorosilicate glass layer, the moisture-resistant layer having a low dielectric constant such that the moisture-resistant layer does not increase a dielectric constant of a resultant layer of the fluorosilicate glass layer and the moisture-resistant layer.

4. The semiconductor fabrication process of claim 3, wherein the moisture-resistant layer is a layer of nitrogen-containing compound.

5. The semiconductor fabrication process of claim 3, wherein the semiconductor components are MOS transistors each having a gate region and a pair of source/drain regions.

* * * * *